United States Patent
Guenais

(10) Patent No.: US 7,283,004 B2
(45) Date of Patent: Oct. 16, 2007

(54) PHASE LOCKED LOOP FILTER

(75) Inventor: Mikael Guenais, Rennes (FR)

(73) Assignee: Freescale Semicondcutor, Inc., Austin, TX (US)

( * ) Notice: Subject to any disclaimer, the term of this patent is extended or adjusted under 35 U.S.C. 154(b) by 0 days.

(21) Appl. No.: 10/561,556

(22) PCT Filed: Jun. 16, 2004

(86) PCT No.: PCT/EP2004/006481

§ 371 (c)(1),
(2), (4) Date: Sep. 6, 2006

(87) PCT Pub. No.: WO2004/114525

PCT Pub. Date: Dec. 29, 2004

(65) Prior Publication Data

US 2007/0090882 A1    Apr. 26, 2007

(30) Foreign Application Priority Data

Jun. 17, 2003 (EP) .................................. 03291465

(51) Int. Cl.
*H03L 7/093* (2006.01)
(52) U.S. Cl. ......................................... 331/17; 331/25
(58) Field of Classification Search ............ 331/8, 331/10, 11, 17, 18, 25; 327/156–159; 332/127; 360/51; 375/376; 455/260
See application file for complete search history.

(56) References Cited

U.S. PATENT DOCUMENTS

| 5,424,689 | A | 6/1995 | Gillig et al. |
| 5,774,023 | A | 6/1998 | Irwin |
| 6,995,607 | B2 * | 2/2006 | Dosho et al. ................ 327/558 |
| 2004/0101081 | A1 | 5/2004 | Hsu |

OTHER PUBLICATIONS

Craninckx et al; "A Fully Integrated CMOS DCS-1800 Frequency Synthesiser"; IEEE Journal of Solid-State Circuits, vol. 33, No. 12, Dec. 1998, pp. 2054-2065.
Craninckx et al; "A Fully Integrated CMOS DCS-1800 Frequency Synthesiser"; IEEE International Solid-State Circuits Conference, pp. 372-374.
Koo et al; "A Fully Integrated CMOS Frequency Synthesiser with Charge-Averaging Charge Pump and Dual-Path Loop Filter for PCS- and Cellular-CDMA Wireless Systems"; IEEE Journal of Solid-State Circuits, vol. 37, No. 5, May 2002.

* cited by examiner

*Primary Examiner*—David Mis

(57) ABSTRACT

A phase locked loop filter comprising a first capacitor for connecting to a first charge pump path; and a parallel resistor/capacitor circuit for connecting to a second charge pump path with the resistor/capacitor circuit having a second capacitor; wherein the first capacitor and second capacitor are connected in series to allow a voltage associated with the first capacitor and a voltage associated with the parallel resistor/capacitor circuit to be added together.

5 Claims, 2 Drawing Sheets

PHASE LOCKED LOOP FILTER

The present invention relates to a phase locked loop filter.

Radiotelephone systems typically require low phase noise, fast switching times, and precise accuracy of the channel frequencies.

In order to design a PLL having the required characteristics (e.g. low phase noise) the associated PLL filter typically requires more than 10 nF of capacitance, where the largest PLL capacitor will be the 'zero' capacitor (i.e. the PLL filter capacitor that is used to create a zero in the filters transfer function, which is necessary for the PLL's stability).

However, it can be difficult and costly to achieve single-chip integration for a PLL that requires such a large capacitance.

One technique that has been developed to reduce the required capacitance for a PLL, thereby allowing single-chip integration, while also retaining the same overall PLL transfer function (i.e. PLL loop dynamics), involves the use of a dual path PLL filter, in which each PLL filter path is driven by a separate charge pump path, for example from a charge pump having two output paths or two separate charge pumps having a single output path.

One example of dual path PLL filter was proposed by Craninckx and Steyaert, IEEE Journal of Solid-State Circuit, Vol. 33, No. 12, December 1998 in which a dual path PLL filter incorporated two active devices, an amplifier and a voltage adder.

Another example of a dual path PLL filter was proposed by Koo, IEEE Journal of Solid-State Circuit, Vol. 37, No. 5, May 2002 in which a dual path PLL filter incorporated a single active device, an amplifier.

However, the use of active devices within a PLL filter increases both phase noise and power consumption as well as increasing the complexity of the PLL filter.

U.S. Pat. No. 5,774,023 discloses a loop filter that includes a high current first pole filter capacitor, a high current first pole damping resistor, a low current first pole filter capacitor, a low current first pole damping resistor and a first pole filter capacitor in which the loop filter is driven by a first charge pump output when current pulses from the charge pump are commensurate with a final narrow loop bandwidth otherwise the loop filter is driven by a second charge pump output. As such U.S. Pat. No. 5,774,023 discloses the switching of current source between the first charge pump output and the second charge pump output rather than simultaneous output.

According to an aspect of the present invention there is provided a phase locked loop filter according to claim 1.

This provides the advantage of allowing a loop filter to be integrated onto a single chip using only three capacitors and two resistive elements without requiring the use of an active component, for example a voltage adder or an integrator.

An embodiment of the invention will now be described, by way of example, with reference to the drawings, of which:

Figure 1:
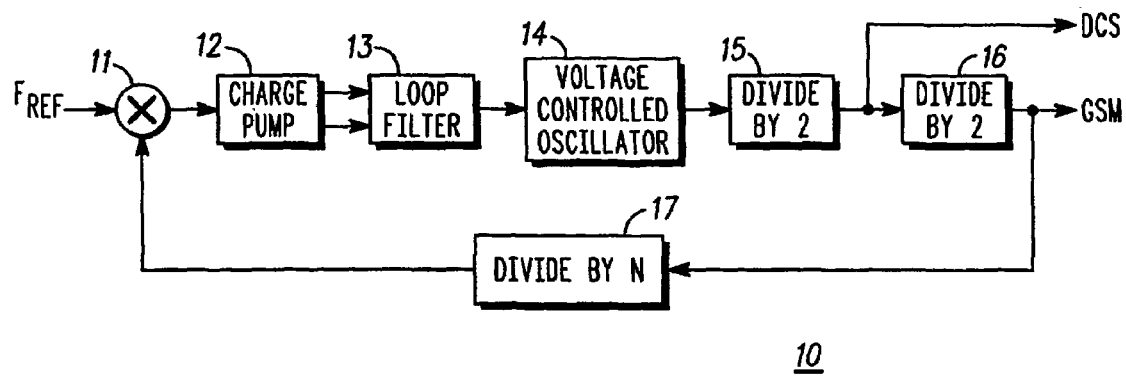
FIG. 1 illustrates a phase locked loop incorporating a filter according to an embodiment of the present invention.

FIG. 1 illustrates a phase locked loop 10 for use in a radiotelephone (not shown). The phase locked loop 10 incorporates a phase detector 11 having a first input for receiving a reference frequency, a second input for receiving a PLL loop frequency and an output for coupling to a charge pump 12. The charge pump 12 has two output paths that are coupled to respective input paths of a loop filter 13. The loop filter 13 is coupled to a voltage controlled oscillator VCO 14. The VCO 14 is coupled to a first x2 divider 15, which provides an input to both a DCS portion of the radiotelephone and to a second x2 divider 16. The second x2 divider 16 provides an input to both a GSM portion of the radiotelephone and to an N divider 17. The N divider 17 is coupled to the second input of the phase detector 11 for providing the PLL loop frequency to the phase detector 11.

Although the embodiment shown in FIG. 1 is arranged for use in a multiband radiotelephone that supports both GSM and DCS, a person skilled in the art would appreciate that a more general PLL structure can be used, where, for example, the VCO 14 could be configured to provide an output frequency at the desired frequency without the need for a divider.

The phase locked loop 10 operates in the following manner, a reference signal, for example a 26 MHz signal, is feed to the phase detector 11. The phase detector 11 compares the phase difference between the reference signal and an output signal from the N divider 17 to generate output pulses proportional to the error between the two phases of the signals. The output pulses from the phase detector 11 are used to either charge or discharge the charge pump 12, where the charge pump 12 has a first current output path and a second current output path, as described below. The signals between the phase detector 11 and the charge pump 12 are voltage signals.

The charge pump 12 charges or discharges the loop filter 13.

The loop filter 13 receives the current output from the first path and the second path and converts the current outputs, which reflect the phase difference between the two frequencies, into a voltage level, as described below. The voltage generated by the loop filter 13 is used to drive the VCO 14, where the VCO 14 is used to reduce the phase difference between the reference frequency and the output frequency of the N divider 17. The purpose of the first x2 divider 15, the second x2 divider 16 and the N divider 17 is to allow the generation of frequencies other than the reference frequency. As would be appreciated by a person skilled in the art by changing the N value it is possible to generate different frequencies, i.e. to act as a synthesizer. For example, the VCO 14 can be arranged, when the PLL 10 has locked to the 26 MHz reference frequency, to generate a 3.6 GHz signal, where the first x2 divider 15 converts the 3.6 GHz signal to a 1.8 GHz signal, suitable for DCS application. Correspondingly, the second 2 divider 16 converts the 1.8 GHz signal to a 0.9 GHz signal, suitable for GSM applications. The N divider 17 is arranged to convert the 0.9 GHz into a 26 MHz signal to maintain phase lock with the 26 MHz reference signal.

Figure 2:
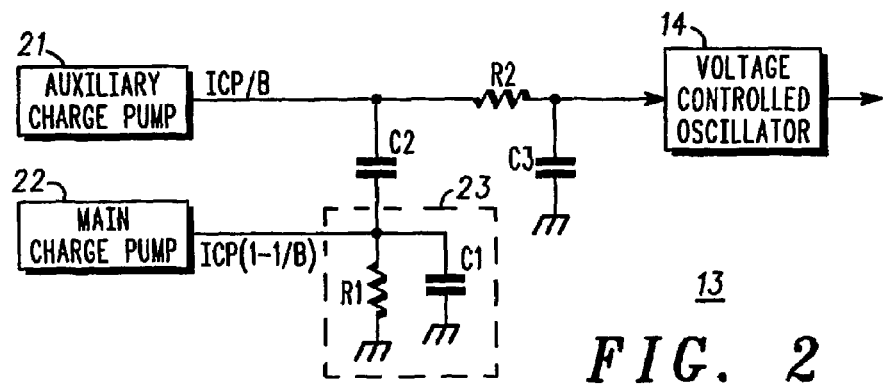
FIG. 2 illustrates a phase locked loop filter according to an embodiment of the present invention.

FIG. 2 illustrates the loop filter 13 coupled to the first charge pump path 21 and the second charge pump path 22. The first charge pump path 21 and the second charge pump path 22 can either be formed from a single charge pump or two separate charge pumps. The first charge pump path 21 is arranged to have a gain that corresponds to a charge pump gain $I_{cp}$ divided by a factor B. The second charge pump path 22 is arranged to generate a second current that corresponds to the charge pump current $I_{cp}$ minus the charge pump current $I_{cp}$ divided by the factor B (i.e. $I_{cp}$–$I_{cp}$/B). However, other current relationships can be used between the first current pump path 21 and the second current pump path 22, however, to ensure that the overall capacitance of the loop filter is kept low it is highly desirable that the current generated on the first current pump path 21 be less than that of the current generated on the second current pump path 22.

The loop filter 13 comprises a parallel resistor/capacitor circuit 23 having a first resistive element R1 (for example, a resistor or an element having the same functionality such as a switched capacitor circuit or a MOS transistor operating in its linear region) in parallel with a first capacitor C1. The parallel resistor/capacitor circuit 23 is coupled at one end to a reference voltage, for example ground or other stable voltage, and at the other end to the second charge pump path 22 and, in series, to a second capacitor C2. The other end of the second capacitor C2 is coupled to the first charge pump path 21, thereby both the first charge pump path 21 and the second charge pump path 22 of the charge pump 12 provide a current simultaneously to the loop filter 13 for both frequency acquisition and locked mode.

For the purposes of this embodiment the loop filter 13 includes an additional pole created by a second resistive element R2 (for example, a resistor or an element having the same functionality such as a switched capacitor circuit or a MOS transistor operating in its linear region) coupled in series between the first charge pump path 21 and the VCO 14 and a third capacitor C3 that is coupled, at one end, between the second resistive element R2 and the VCO 14 and at the other end to a reference voltage, for example ground or other stable voltage. The purpose of the additional pole, created by the second resistive element R2 and third capacitor C3, is to further suppress phase noise and, though not essential, is a desirable feature.

Figure 3:
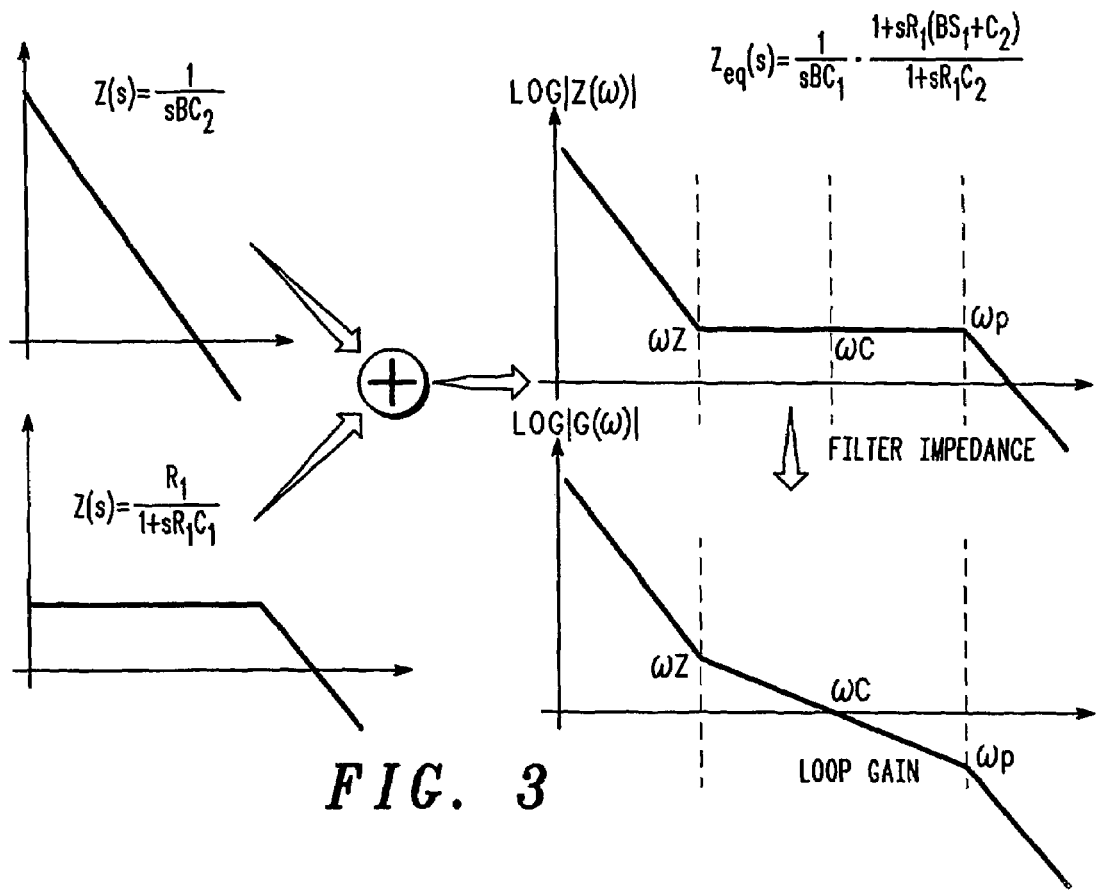
FIG. 3 shows graphs illustrate dual path characteristics of a phase locked loop filter according to an embodiment of the present invention.

The voltage formed across the second capacitor C2 corresponds to the integrated input current and is governed by the equation in the s-domain, as shown in FIG. 3:

$$V_B = \frac{I_{cp}}{B} \frac{1}{sC_2}$$

The voltage formed across the parallel resistor/capacitor circuit 23 corresponds to a low pass transfer with a pole $\omega_p$ and is governed by the equation, as shown in FIG. 3:

$$V_A = I_{cp}(R_1 \| C_1)$$

Consequently, the equivalent impedance of the loop filter can be calculated by:

$$Z_{eq}(s) = \frac{V_A + V_B}{I_{cp}} = \frac{1}{sBC_2} \cdot \frac{1 + sR_1(BC_2 + C_1)}{1 + sR_1 C_1}$$

As the first capacitor C1 and the second capacitor C2 are placed in series this results in the voltages $V_A$ and $V_B$ being added, thereby combining the integrated voltage and the low pass transfer voltage. The resulting loop filter impedance and loop filter gain is shown in FIG. 3.

As the second capacitor C2 is used to integrate the input voltage, and correspondingly is used to form the required zero for the loop filter 13, using a factor B to divide the charge pump current $I_{cp}$ provides the advantage of allowing the zero to be placed low enough, as illustrated in the filter impedance and loop gain graphs in FIG. 3, without requiring large capacitance values.

The choice of the value of B depends of several factors. If the value of B increases the overall capacitance decreases, as such if capacitance is an issue you may want to put B as high as possible. However, there are several upper limits to the value of B. First, when B increases the in-band phase noise increases at the same rate. Second, it has been found that for a passive dual path filter with an additional pole (i.e. R1/C2 in series with C1, followed by a R3/C2 pole) no mathematical solution exists when B reaches a value between 35 and 40, slightly depending on the loop parameters. Third, is the minimum current source that is practically achievable; if B increases, the auxiliary charge-pump gain decreases at the rate of 1/B. This can give extremely small current sources (lower than 1 uA) that are difficult to control.

Figure 4:
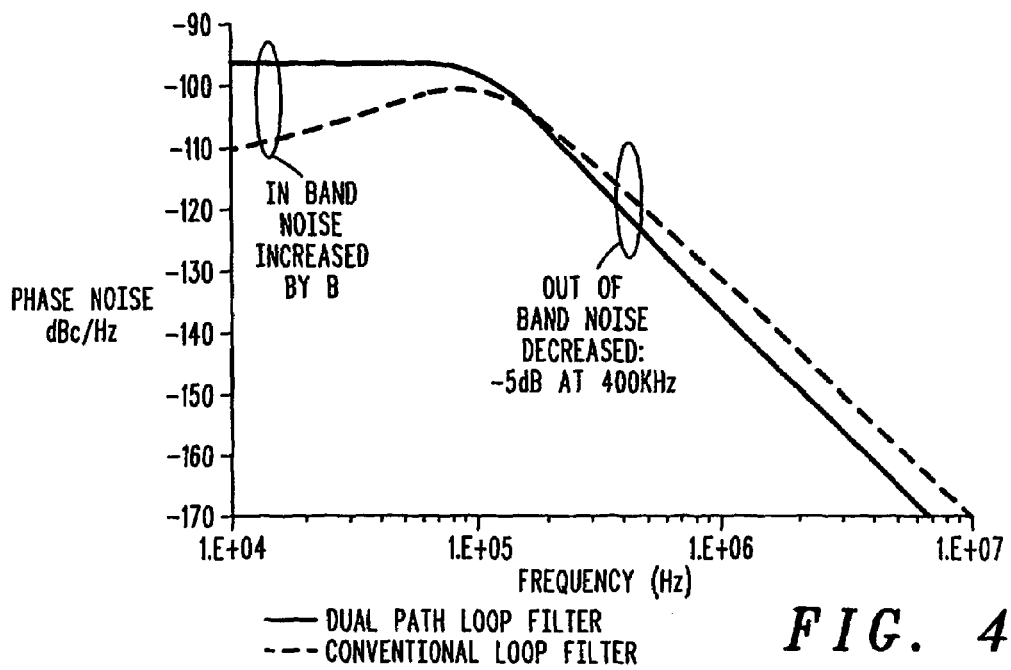
FIG. 4 illustrates a graph showing the phase noise characteristics of a phase locked loop filter according to an embodiment of the present invention.

The low frequency path of the loop filter 13 formed between the first charge pump path 21 and the VCO 14 will, as a result of the charge pump current being divided by the factor B, be noisier than the high frequency path formed between the second charge pump path 22 and the VCO 14. However, as the bandwidth of the low frequency path is smaller than the loop filter bandwidth, as determined by the high frequency path, the additional noise generated on the low frequency path will have no impact on the out-of-band phase noise. In fact, as shown in FIG. 4, the noise generated by the low frequency path will be less than that of the high frequency path at offset frequencies higher than the loop filter bandwidth.

By way of example, using the above described loop filter, values for the first capacitor C1, the second capacitor C2, the third capacitor C3, the first resistive element R1 and the second resistive element R2 will now be calculated based on the following loop filter parameters:

Bandwidth 100 kHz
KVCO=400 MHz/V
Ref frequency 26 MHz
Dual Path ratio factor B=30

Given the values of Icp, KVCO, ref. frequency, bandwidth and by solving the loop filter impedance equation $Z_{eq}(s)$ it is possible to obtain the appropriate values for the required capacitors and resistors. Consequently, utilizing the loop filter impedance equation for $Z_{eq}(s)$, as given above, with a first current pump path current of 20 uA (i.e. 600 uA /30) and a second current pump path current of 580 uA (i.e. 600 uA–20 uA) the following components values can be calculated:

C2=90 pF
R1=1480 ohms
C1=225 pF
R2=4700 ohms
C3=300 pF

Therefore, the total loop filter capacitance for a loop filter based upon the loop filter described above is 615 pF.

This compares with a standard loop filter coupled to a single path charge pump where the corresponding component values would be:

C2=10 nF
R1=410 ohms
C1=880 pF
R2=1110 ohms
C3=300 pF

Therefore, the total loop filter capacitance for a single path loop filter is of the order of 11 nF.

The invention claimed is:

1. A phase locked loop system for integration onto an integrated circuit comprising a charge pump arranged to output a first current over a first charge pump path while a second current is output over a second charge pump path; and a phase locked loop filter characterised in that it comprises only a first capacitor electrically coupled between the first charge pump path and the second charge pump path; and a parallel resistor/capacitor circuit electrically coupled to the second charge pump path with the resistor/capacitor circuit having a second capacitor and a first resistive element; wherein the first capacitor and second capacitor are connected in series to allow a voltage associated with the first capacitor and a voltage associated with the parallel resistor/capacitor circuit to be added together, and an extra pole having a second resistive element and a shunt capacitor coupled, at one end to the second resistive element and at the other end to a reference voltage.

2. A phase locked loop system according to claim 1, wherein the current flow in the second path is greater than the current flow in the first path to allow a decrease in the capacitance of the phase locked loop filter.

3. A phase locked loop system according to claim 1, wherein the added voltage is arranged to control a voltage controlled oscillator.

4. An electronic device incorporating a phase locked loop system according to claim 1.

5. A radiotelephone incorporating a phase locked loop system according to claim 1.

* * * * *